United States Patent
Choi

(10) Patent No.: US 10,157,973 B2
(45) Date of Patent: Dec. 18, 2018

(54) ORGANIC LIGHT EMITTING DISPLAY DEVICE

(71) Applicant: LG Display Co., Ltd., Seoul (KR)

(72) Inventor: HeeDong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 15/145,768

(22) Filed: May 3, 2016

(65) Prior Publication Data

US 2016/0247872 A1 Aug. 25, 2016

Related U.S. Application Data

(63) Continuation of application No. 14/537,740, filed on Nov. 10, 2014, now Pat. No. 9,356,081.

(30) Foreign Application Priority Data

Nov. 15, 2013 (KR) .................. 10-2013-0138837

(51) Int. Cl.
*H01L 27/32* (2006.01)
*H01L 27/12* (2006.01)
*H01L 51/52* (2006.01)
*G09G 3/3258* (2016.01)

(52) U.S. Cl.
CPC ....... *H01L 27/3276* (2013.01); *G09G 3/3258* (2013.01); *H01L 27/1225* (2013.01);
(Continued)

(58) Field of Classification Search
CPC ............. H01L 27/3248; H01L 27/1225; H01L 27/3262; H01L 27/3265; H01L 27/3269;
(Continued)

(56) References Cited

U.S. PATENT DOCUMENTS

| 2001/0035863 A1 | 11/2001 | Kimura |
| 2003/0107534 A1 | 6/2003 | Koyama et al. |

(Continued)

FOREIGN PATENT DOCUMENTS

| CN | 101944323 A | 1/2011 |
| CN | 102290421 A | 12/2011 |

(Continued)

OTHER PUBLICATIONS

Chinese Office Action, Chinese Application No. 201410647585.6, dated Jul. 26, 2016, 9 pages (with concise explanation of relevance).

(Continued)

*Primary Examiner* — Nimeshkumar Patel
*Assistant Examiner* — Jacob R Stern
(74) *Attorney, Agent, or Firm* — Fenwick & West LLP

(57) ABSTRACT

An organic light emitting display device comprises a driving transistor for driving an organic light emitting diode; a first transistor controlled by a scan signal and connected between a reference voltage line and a first node of the driving transistor; a second transistor controlled by the scan signal and connected between a data line and a second node of the driving transistor; a first plate with an improved conductive characteristic and connected to the semiconductor layer of the driving transistor and the semiconductor layer of the first transistor; a second plate positioned on the first plate, and connected to the semiconductor layer of the second transistor and a gate electrode of the driving transistor; and a pixel electrode of the organic light emitting diode, positioned on the second plate and connected to the first plate through a contact hole.

12 Claims, 16 Drawing Sheets

(52) U.S. Cl.
CPC ...... *H01L 27/3248* (2013.01); *H01L 27/3262* (2013.01); *H01L 27/3265* (2013.01); *H01L 27/3269* (2013.01); *H01L 51/52* (2013.01); *H01L 51/5237* (2013.01); *G09G 2300/0465* (2013.01); *G09G 2300/0842* (2013.01); *G09G 2320/0233* (2013.01)

(58) Field of Classification Search
CPC . H01L 27/3276; H01L 51/52; H01L 51/5237; G09G 2300/0465; G09G 2300/0842; G09G 2320/0233; G09G 3/3258
See application file for complete search history.

(56) References Cited

U.S. PATENT DOCUMENTS

| | | |
|---|---|---|
| 2003/0189535 A1 | 10/2003 | Matsumoto et al. |
| 2006/0248420 A1 | 11/2006 | Jeong |
| 2007/0115226 A1 | 5/2007 | Jung et al. |
| 2008/0142827 A1 | 6/2008 | Choi et al. |
| 2010/0007651 A1 | 1/2010 | Kim |
| 2010/0208507 A1* | 8/2010 | Park et al. .................... 365/111 |

FOREIGN PATENT DOCUMENTS

| | | |
|---|---|---|
| CN | 102654976 A | 9/2012 |
| JP | 2001147659 A | 5/2001 |
| TW | 200412562 A | 7/2004 |

OTHER PUBLICATIONS

European Patent Office, Search Report and Opinion, European Patent Application No. 14192723.6, dated Feb. 13, 2015, nine pages.
United States Office Action, U.S. Appl. No. 14/537,740, dated Jul. 10, 2015, 10 pages.

* cited by examiner

ORGANIC LIGHT EMITTING DISPLAY DEVICE

CROSS-REFERENCE TO RELATED APPLICATIONS

This application is a continuation of U.S. patent application Ser. No. 14/537,740, filed on Nov. 10, 2014, which claims priority from and the benefit under 35 U.S.C. § 119(a) of Korean Patent Application No. 10-2013-0138837, filed on Nov. 15, 2013, both of which are hereby incorporated by reference for all purposes as if fully set forth herein.

BACKGROUND

1. Technical Field

The present disclosure relates to an organic light emitting display device.

2. Description of the Prior Art

Recently, organic light emitting display devices have been in the spotlight as being display devices having fast response rates, high light emitting efficiency, high luminance, and wide viewing angles. These advantages are due to the use of an organic light emitting diode, which is self-illuminating (emits light by itself).

Such an organic light emitting display device includes pixels arranged in a matrix form, the pixels including an organic light emitting diode. The display device controls brightness of pixels that are selected by a scan signal, according to a grayscale of data.

Each pixel of the organic light emitting display device includes, in addition to the organic light emitting diode, a data line and a gate line crossing each other, a transistor, and a storage capacitor connected to the data line and the gate line.

Each pixel may include a corresponding transistor in order to further perform various functions. Therefore, a number of signal lines for providing various signals to transistors increases, and thus a pixel structure becomes more complex. For example, when an internal or external compensation circuit for compensating for luminance non-uniformity between pixels is applied to a pixel structure, a transistor related to a sensing operation for a compensation may be added. This increases the number of necessary signal lines, and thus this causes complexity of the pixel structure.

In addition, according to a demand or design need for a larger size and a higher resolution, the number of signal lines may be increased, and thus a pixel structure becomes more complex.

As described above, the number of the signal lines is increased due to the increased number of design needs, such as additions of various functions such as sensing and compensation functions, need for larger size and the higher resoluton. Therefore, the number of IC pads and the number of ICs are increased, and thus the pixel structure becomes more complex.

This may complicate the manufacturing process, increase the possibility of defects, remarkably reduce an opening ratio, and considerably reduce the lifespan of an organic light emitting diode. Ultimately, a high quality diplay panel may not manufactured and thus the throughput may be reduced.

SUMMARY

Against this background, an aspect of the present disclosure is to provide an organic light emitting display device having a simple and compact structure.

Another aspect of the present disclosure is to provide an organic light emitting display device having a pixel structure with an improved opening ratio.

Another aspect of the present disclosure is to provide an organic light emitting display device having a pixel structure including a double capacitor in a pixel by a simplified process flow.

Another aspect of the present disclosure is to provide an organic light emitting display device having a pixel structure capable of preventing a short defect which may be caused by a step difference due to a contact hole.

In accordance with an aspect of the present disclosure, an organic light emitting display device comprises a driving transistor, including a semiconductor layer that includes an oxide semiconductor material, and for driving an organic light emitting diode. The display device further comprises a first transistor including a semiconductor layer including an oxide semiconductor material, controlled by a scan signal, and connected between a reference voltage line and a first node of the driving transistor. The display device further comprises a second transistor including a semiconductor layer including the oxide semiconductor material, controlled by the scan signal commonly provided from a gate line, and connected between a data line and a second node of the driving transistor. The display device also includes a first plate including the oxide semiconductor material of which conductive characteristic is improved, and connected to the semiconductor layer of the driving transistor and the semiconductor layer of the first transistor. The display device also includes a second plate positioned on the first plate, and connected to the semiconductor layer of the second transistor and a gate electrode of the driving transistor. The device further includes a pixel electrode of the organic light emitting diode, positioned on the second plate and connected to the first plate through a contact hole.

As described above, according to the present disclosure, an organic light emitting display device can provide a simple and compact structure.

In addition, according to the present disclosure, an organic light emitting display device can provide a pixel structure capable of increasing an opening ratio.

In addition, according to the present disclosure, an organic light emitting display device can include a double capacitor in a pixel by a simplified process flow.

In addition, according to the present disclosure, an organic light emitting display device can prevent a short defect, which may be caused by a step difference due to a contact hole.

Thus, a display panel having a good quality can be manufactured in a high throughput.

These structural improvements and resulting functional advantages are further emphasized when applied to a display panel having a high resolution and a large size.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
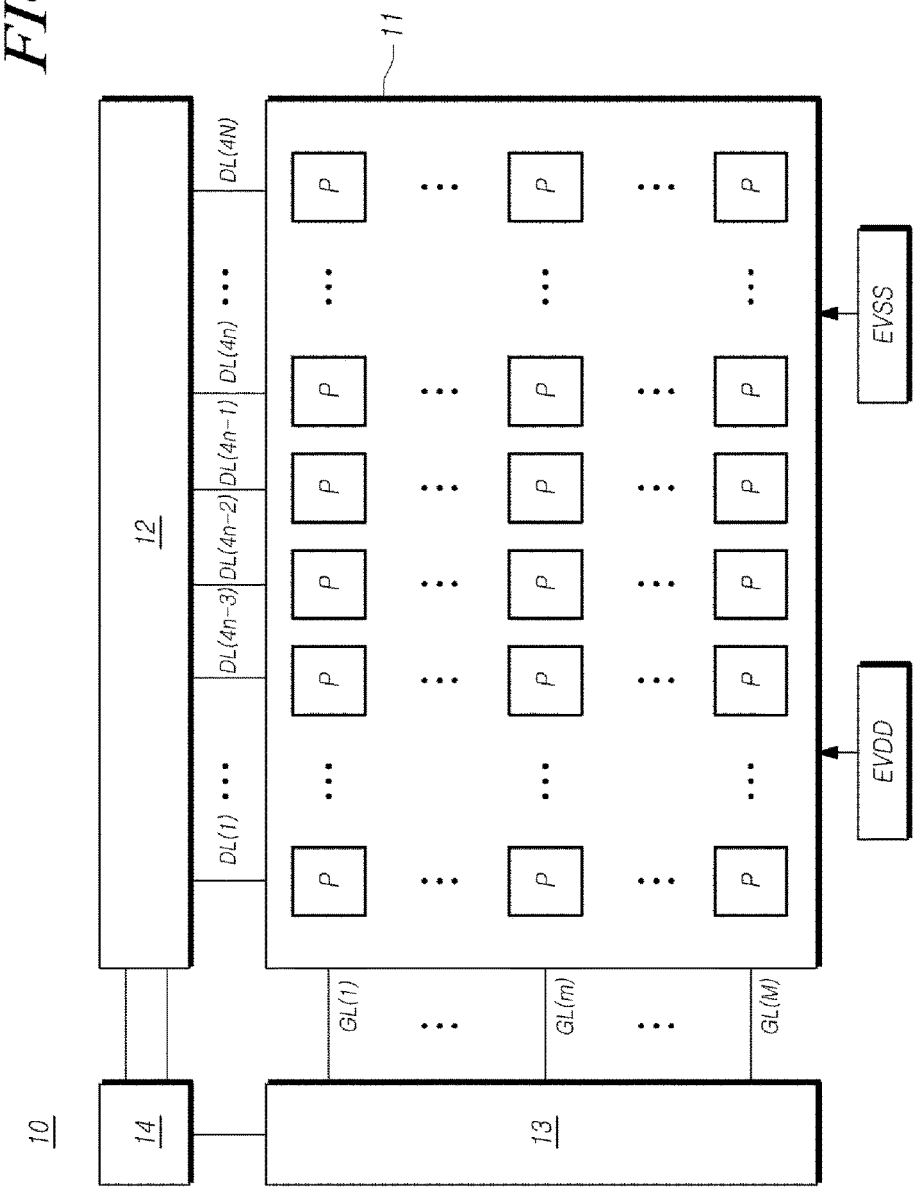
FIG. 1 is an overall system construction diagram for an organic light emitting display device to which embodiments are applied.

Hereinafter, embodiments of the present disclosure will be described in detail with reference to the accompanying drawings. In the following description, the same elements will be designated by the same reference numerals although they are shown in different drawings. Further, in the following description of the present disclosure, a detailed description of known functions and configurations incorporated herein will be omitted when it may not provide additional clarity to the subject matter of the present disclosure.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Embodiments of the present disclosure provide an organic light emitting display device having a panel structure with a simple and compact pixel structure, despite an increased number of signal lines connected to the pixel. In other words, positions of a transistor, a capacitor, an organic light emitting diode, and a signal line connection is simplified and compact in the pixel structure, according to some embodiments.

Therefore, an opening ratio can be increased, defect occurrence possibility can be reduced, manufacturing can be easier, and a panel having a good quality can be manufactured in a high throughput. Specifically, such an effect may becomes larger when an organic light emitting display device including a panel of a high resolution and a large size is manufactured.

FIG. 1 is an overall system construction diagram for an organic light emitting display device to which embodiments are applied.

Referring to FIG. 1, an organic light emitting display device 10, to which embodiments are applied, includes a display panel 11, a data driving unit 12, a gate driving unit 13 and a timing controller 14. The display panel 11 includes a plurality of pixels P disposed in areas where a data line DL (of a plurality of data lines DL formed in a direction) intersects with a gate line GL (of a plurality of gate lines GL formed in another direction). The data driving unit 12 provides a data voltage through the data line. The gate driving unit 13 provides a scan signal through the gate line. The timing controller 14 controls the driving timing of the data driving unit 12 and the gate driving unit 13.

Referring to FIG. 1, in the display panel 11, the plurality of data lines DL1, . . . , and DL4N are formed in a direction and the plurality of gate lines GL1, . . . , and GLM are formed in another direction, the gate lines GL1, . . . , and GLM intersecting the data lines DL1, . . . , and DL4N.

In the display panel 11, each pixel P is defined in an area where the data lines DL1, . . . , and DL4N and the M gate lines GL1, . . . , and GLM intersect. A pixel structure for each pixel P is described in more detail with reference to FIG. 2.

Figure 2:
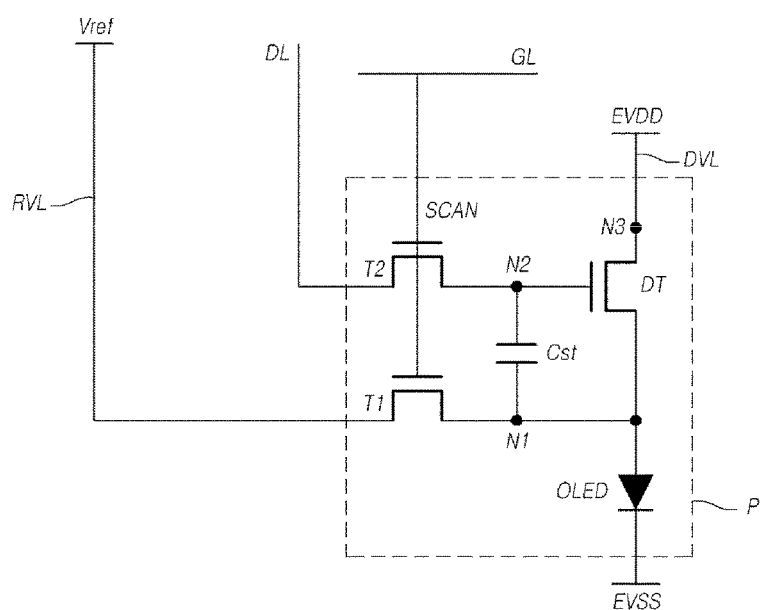
FIG. 2 is an equivalent circuit diagram for a pixel in a display panel of the organic light emitting display device of FIG. 1, according to one or more embodiments.

FIG. 2 is an equivalent circuit diagram for a pixel in the display panel of the organic light emitting display device of FIG. 1, accoring to one or more embodiments.

Referring to FIG. 2, each pixel P is connected to one data line DL, and receives only one scan signal SCAN through one gate line GL.

As shown in FIG. 2, each pixel includes an Organic Light Emitting Diode (OLED), a driving transistor DT, a first transistor T1, a second transistor T2, a storage capacitor Cst, and the like. As described above, each pixel includes three transistors DT, T1, and T2 and one storage capacitor Cst, and thus it is referred to that each pixel has a 3T(Transistor)1C (Capacitor) structure.

The driving transistor DT in each pixel receives a driving voltage EVDD provided through a driving voltage line DVL, and is a transistor driving the OLED under a control of a voltage (i.e., a data voltage) of a gate node N2, which is applied through the second transistor T2.

The driving transistor DT includes a first node N1, the second node N2, and a third node N3. The driving transistor DT is connected to the first transistor T1 through the first node N1, the driving transistor DT is connected to the second node N2, and receives the driving voltage EVDD through the third node N3.

Here, for an example, the first node of the driving transistor DT may be a source node (may be referred to as a source electrode), the second node of the driving transistor DT may be a gate node (may be referred to as a gate electrode), and the third node of the driving transistor DT may be a drain node (may be referred to as a drain electrode). The first node, the second node, and the third node of the driving transistor DT may be changed according to a type change of a transistor, a circuit change, and the like.

In addition, the first transistor T1 is controlled by the scan signal SCAN provided from the gate line GL. The first transistor T1 is connected between the first node N1 of the driving transistor DT and a reference voltage line RVL providing a reference voltage Vref or a connection pattern CP connected to the reference voltage line RVL. The first transistor T1 may be referred to as a sensor transistor.

In addition, the second transistor T2 is controlled by the scan signal SCAN commonly provided through the gate line GL, and is connected between a corresponding data line DL and the second node N2 of the driving transistor DT. The second transistor T2 may be referred to as a switching transistor.

In addition, the storage capacitor Cst is connected between the first node N1 and the second node N2 of the driving transistor. The storage capacitor Cst may maintain a data voltage during one frame.

As described above, the first transistor T1 and the second transistor T2 are controlled by one scan signal provided through one gate line (i.e., a common gate line). As described above, since each pixel uses one scan signal, each pixel has a basic pixel structure of a "3T1C based 1 scan structure" in a first embodiment of the present disclosure.

Related to the 3T1C based 1 scan structure, the second transistor T2 basically is a transistor that serves a driving function which applies a data voltage to the gate node N2 of the driving transistor DT. The first transistor T1 may also be related to a driving function, however, the first transistor basically is a transistor that serves a sensing function which compensates for a luminance deviation between pixels. Since uses and functions of the two transistors T1 and T2 are different, controlling of the two transistors T1 and T2 using one scan signal has an effect on related operations (e.g., a driving operation and a sensing operation). Therefore, in order to properly perform a driving operation, a sensing operation and the like of a pixel, a separate device (e.g., a second switch and the like) and a change of an operation scheme (e.g., an operation timing and the like) may be necessary, and this will be described together with a compensation construction (function) described later.

As described above, each pixel according to the organic light emitting display device 10 of the first embodiment has the "3T1C based 1 scan structure (i.e., a common scan structure)" which receives one scan signal SCAN through one gate line GL under the 3T1C structure. That is, the scan signal (i.e., a common scan signal) provided through one gate line GL (e.g., a common gate line connected to both the first and second transistors) is commonly applied to the gate node of the first transistor and the gate node of the second transistor. Alternatively, different scan signals may be applied to the gate node of the first transistor and the gate node of the second transistor, respectively.

Meanwhile, the pixel structure of the organic light emitting display device 10, according to the first embodiment, includes a "signal line connection structure" related to a connection between each pixel and various signal lines, such as the data line, the gate line GL, the driving voltage line DVL, and the reference voltage line RVL, in addition to the "basic pixel structure (i.e., 3T1C based 1 scan structure)" described with reference to FIG. 2.

Here, the various signal lines further include the reference voltage line RVL for providing the reference voltage Vref to each pixel, the driving voltage line DVL for providing the driving voltage EVDD to each pixel, and the like, in addition to the data line for providing the data voltage to each pixel and the gate line for providing the scan signal to each pixel.

The above-mentioned reference voltage line RVL and the driving voltage line DVL are formed in parallel with the data line DL. The number of the reference voltage lines RVL and the number of the driving voltage lines DVL may be the same as the number of the data lines or may be different from the number of the data lines.

When the number of the reference voltage lines RVL and the number of the driving voltage lines DVL are the same as the number of the data lines, each pixel is connected to one data line DL and one gate line GL, and may be directly connected to one driving voltage line DVL and one reference voltage line RVL.

In this case, all of the signal line connection structures of each pixel may be the same. That is, a basic unit of the signal line connection structure is one pixel, and thus the signal line connection structure may be regular per one pixel (i.e., one pixel row).

In addition, in the present specification and drawings, the pixel connected to the data line DL may be, for example, an R (red) pixel, a G (green) pixel, a B (blue) pixel and a W (White) pixel.

When the number of the reference voltage lines RVL and the number of the driving voltage lines DVL are smaller than the number of the data lines, some pixels may be directly connected to the driving voltage line DVL and the reference voltage line RVL, and other pixels may be connected to each of the driving voltage line DVL and the reference voltage line RVL through the connection pattern CP (illustrated, for instance, in FIGS. 3A and 6A) instead the other pixels are directly connected to the driving voltage line DVL and the reference voltage line RVL.

In this case, the signal line connection structures of each pixel may be different. However, although the signal line connection structures of each pixel are different, the signal line connection structures may be the same per a plurality of pixels. That is, a unit of the signal line connection structure may be the plurality of pixels not one pixel P. The signal line connection structure may be repeatedly regular per the plurality of pixels (i.e., a plurality of pixel rows).

In addition, in the present specification and drawings, the transistors DT, T1 and T2 are N types, however, these are for convenience of description, and according to a circuit design change, all of the transistors DT, T1, and T2 may be changed to P types. Alternatively, some of the transistors DT, T1 and T2 may be implemented as N types and others of the transistors DT, T1 and T2 may be implemented as P types. In addition, the OLED may be changed to an inverted type.

In addition, the transistors DT, T1 and T2 described in the present specification may be referred to Thin Film Transistors (TFTs).

Aspects of a First Embodiment

Figure 3A:
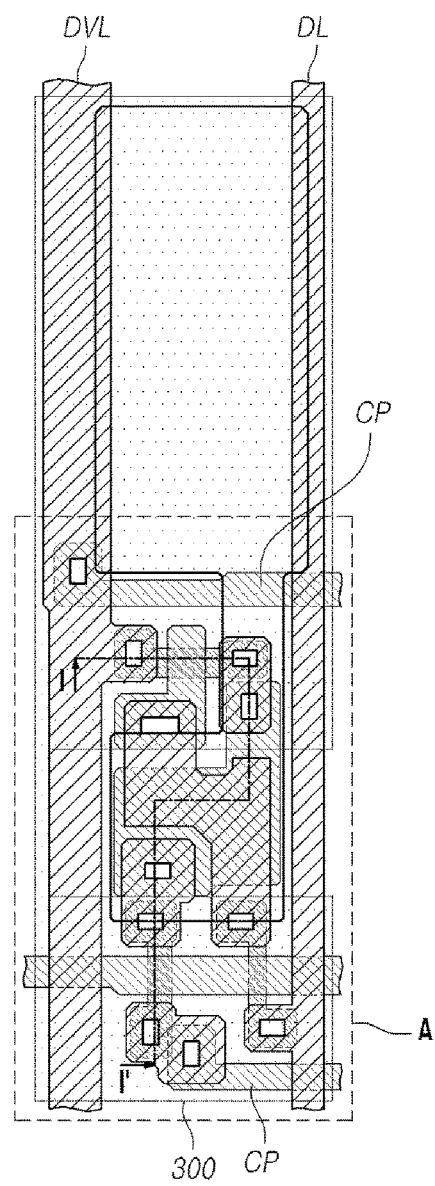
FIG. 3A is a cross-sectional view schematically illustrating a portion of a display panel of an organic light emitting display device according to a first embodiment.
Figure 3B:
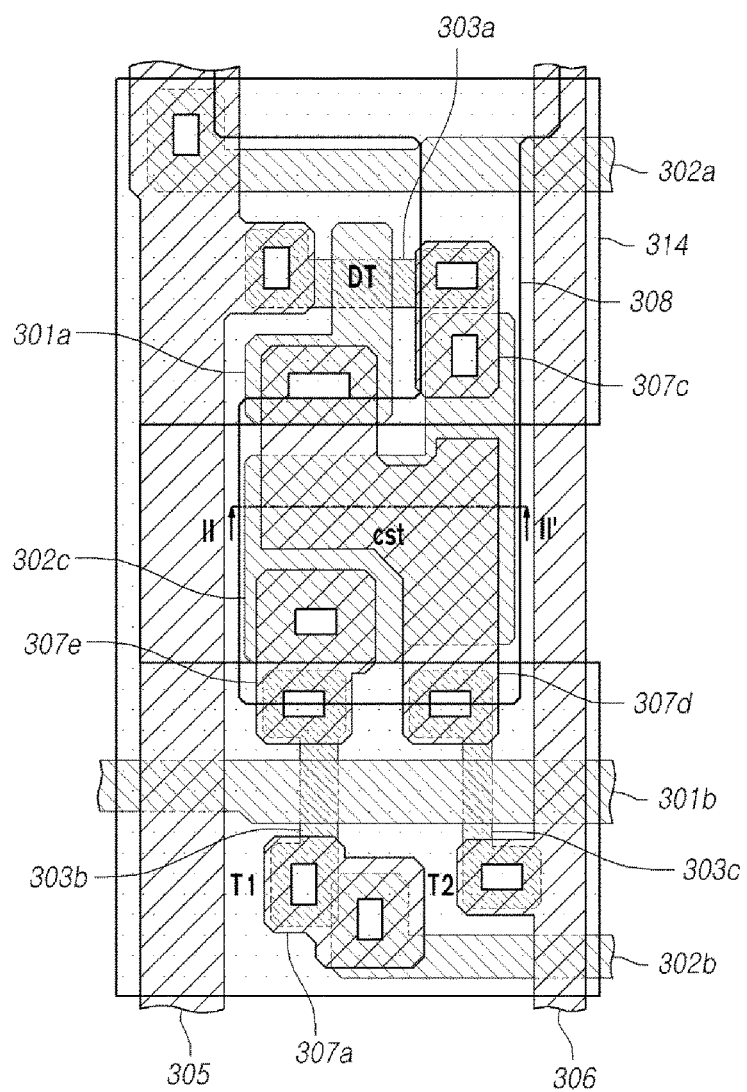
FIG. 3B is an enlarged view of a portion A in FIG. 3A, according to the first embodiment.

FIG. 3A is a cross-sectional view schematically illustrating a portion of the display panel of the organic light emitting display device according to the first embodiment. FIG. 3B is an enlarged view of a portion A in FIG. 3A, according to the first embodiment.

Referring to FIGS. 3A and 3B, and as explained above with reference to FIG. 2, each pixel P connected to the data line DL includes the driving transistor DT receiving the driving voltage EVDD and driving the OLED, the first transistor T1 (see FIG. 3B) receiving the reference voltage Vref and transferring the reference voltage Vref to the first node N1 of the driving transistor DT (FIG. 3B), the second transistor T2 (FIG. 3B) receiving the data voltage Vdata and transferring the data voltage Vdata to the second node N2 of the driving transistor DT, the capacitor Cst (FIG. 3B) connected between the first node N1 and the second node N2 of the driving transistor DT, and the like. As described above, the pixel structure of such a pixel is referred to as the "3T1C based 1 scan structure".

As described above, since uses and functions of the two transistors T1 and T2 are different, controlling the two transistors T1 and T2 by applying the scan signal from one gate line may have a large effect on the driving operations and sensing operations related to the two transistors T1 and T2. Therefore, the first embodiment of the present disclosure needs a driving method and an additional construction (e.g., a second switch and the like) so as to normally perform a driving operation and a sensing operation of the pixel without problems, in implementing a simple and compact pixel structure, that is, the 3T1C based 1 scan structure.

The first transistor T1 is the sensor transistor which senses to compensate for a luminance deviation between the pixels, and the second transistor T2 is the switching transistor which selects the driving transistor.

A semiconductor layer 303a of each driving transistor DT, a semiconductor layer 303b of each first transistor T1 and a semiconductor layer 303c of each second transistor T2 are formed on a substrate 300.

The semiconductor layer 303a of each driving transistor DT is formed in correspondence to an area where a gate electrode 301a of each driving transistor DT is formed. The semiconductor layer 303b of each first transistor T1 is formed in correspondence to a portion playing a role of a gate electrode in a gate line 301b of each first transistor T1. The semiconductor layer 303c of each second transistor T2 is formed in correspondence to a portion playing a role of a gate electrode in a gate line 301b of each second transistor T2.

An area of the semiconductor layer 303a of each driving transistor DT, corresponding to the area where the gate electrode 301a is formed is a first area 303ab which is a channel area. An area of the semiconductor layer 303b of each first transistor T1, corresponding to the gate line 301b is a first area 303ba which is a channel area. An area of the semiconductor layer 303c of each second transistor T2, corresponding to the gate line 301b becomes a channel area. Both sides of each channel area become source-drain areas by an injection of impurities.

Next, the gate electrode 301a of each driving transistor DT, the gate line 301b for forming the gate electrodes of the first and second transistors T1 and T2, a connection pattern 302a connected to each driving voltage line DVL, a connection pattern 302b connected to each reference voltage line RVL, and a first plate 302c for forming each storage capacitor Cst are formed, on the substrate 300 on which the semiconductor layer 303a of each driving transistor DT, the semiconductor layer 303b of each first transistor T1 and the semiconductor layer 303c of each second transistor T2 are formed.

Here, the gate line 301b is a common gate line for commonly applying the scan signal to the gate electrodes of the first and second transistors T1 and T2 included in the pixel, which are connected to the gate line 301b. Therefore, a portion where the gate electrode is formed in the gate line 301b is formed wider than other portions in consideration of a channel length L which is a designed value. In addition, a portion where a gate electrode is not formed in the gate line 301b may be narrowly formed in order to minimize a parasitic capacitance.

Next, the signal lines such as the driving voltage line 305 and the data lines 306 corresponding each pixel row are formed on the substrate 300.

A drain electrode 307a of the first transistor T1 connected to the connection pattern 302a (i.e., the connection pattern of the reference voltage line), which is formed on the substrate 300, through a contact hole, a drain electrode 307c of each driving transistor of all pixels, a second plate 307d playing a role of forming the storage capacitor by including a portion connected to the gate electrode 301a of the driving transistor DT of each pixel through a contact hole and a portion playing a role of the source electrode of the second transistor T2 of each pixel, a source electrode 307e of the first transistor T1 of each pixel, which is connected to the first plate 302c through a contact hole, and the like are further formed.

The first plate 302c connected to the source electrode 307c of the driving transistor DT of each pixel, and a pixel electrode 308 connected to the source electrode 307e of the first transistor T1 through the contact hole in each pixel are formed per each pixel.

A pixel defining film (referred to as a bank) 309 (illustrating in the cross sectional view of FIG. 4) which defines the pixel is formed. An organic layer (not shown) including a light emitting layer corresponding to each pixel may be laminated on the pixel defining film 309, and a common electrode for all pixels may be laminated on the organic layer. Meanwhile, in a case of a White Organic Light Emitting Diode (WOLED), an organic layer including the same light emitting layer may be laminated and a color filter may be formed in a light emitting direction in all pixels.

Figure 4:
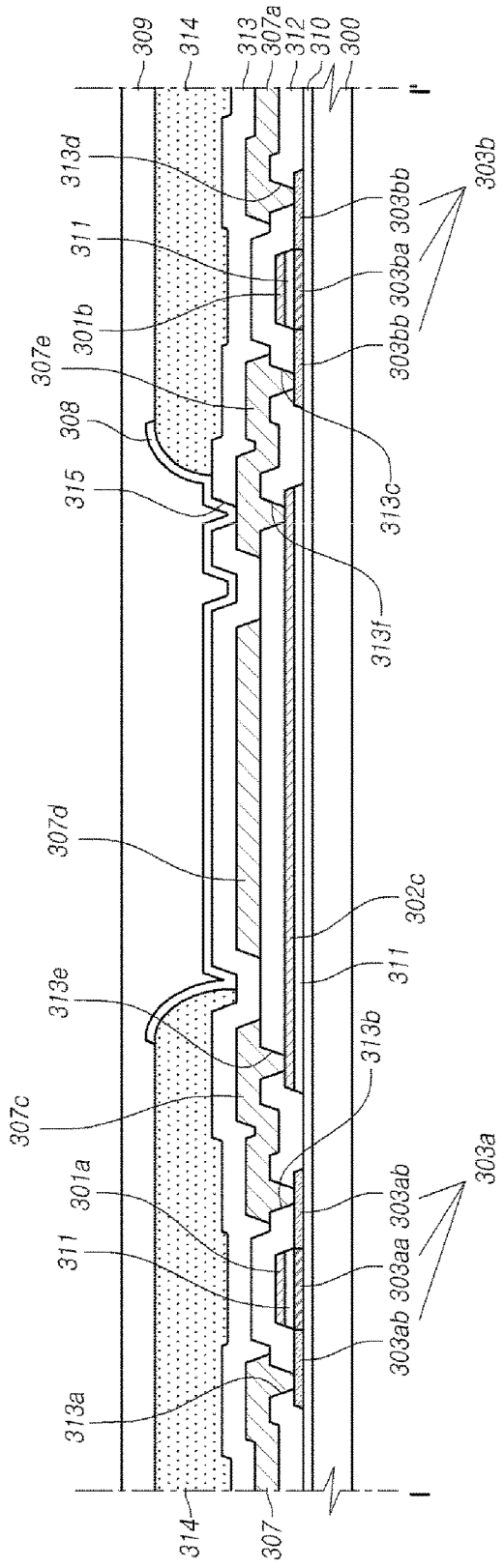
FIG. 4 is a cross-sectional view taken along a cutting line I-I' of FIG. 3A, according to one or more embodiments.
Figure 5:
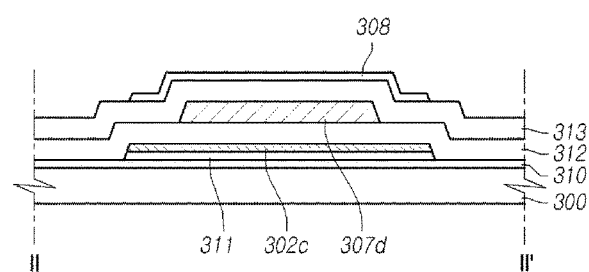
FIG. 5 is a cross-sectional view taken along a cutting line II-II' of FIG. 3B, according to one or more embodiments.

FIG. 4 is a cross-sectional view taken along a cutting line I-I' of FIG. 3A. FIG. 5 is a cross-sectional view taken along a cutting line II-II' of FIG. 3B.

Referring to FIGS. 3A to 5, a buffer layer 310 is formed on the substrate 300. The semiconductor layer 303a of the driving transistor DT and the semiconductor layer 303b of each first transistor T1 are formed on the substrate 300 on which the buffer layer 310 is formed. As described above, although not shown in FIG. 4, the semiconductor layer 303c of the second transistor T2 is formed on the substrate in a manner similar to the semiconductor layer 303a of the driving transistor DT and the semiconductor layer 303b of each first transistor T1. Each of the semiconductor layers 303a and 303b includes first areas 303aa and 303ba where a plasma is not processed in central areas thereof, and second areas 303ab and 303bb which are conductive by a plasma process and positioned at both sides of the first areas 303aa and 303ba, respectively. Similarly, the semiconductor layer 303c of the second transistor T2 includes a first area where a plasma is not processed in a central area thereof, and second areas which become conductive by way of a plasma process and positioned at both sides of the first area.

Next, a gate insulating film 311 is formed in correspondence to the first area 303aa on the substrate 300 and the oxide semiconductor layer 303a including the first and second areas 303aa and 303ab. In addition, the gate insulating film 311 is formed in correspondence to the first area 303ba on the substrate 300 and the oxide semiconductor layer 303b including the first and second areas 303ba and 303bb. Additionally, the gate insulating film 311 is formed on the buffer layer 310 in correspondence to the first plate 302c for forming the storage capacitor Cst. Similarly, the gate insulating film 311 is formed in correspondence to the first area of the semiconductor layer 303c of the second transistor T2.

Next, the gate line 301b having a plane form equal to that of the gate insulating film 311 and extending in a direction on the gate insulating film 311 formed on the substrate 300 is formed. The gate line 301b formed on the first area 303ab plays the role of the gate electrode of the first transistor T1. The gate line 301b extends in a direction on the gate insulating film 311, which is formed in correspondence to the first area of the semiconductor layer 303c of the second transistor T2. The gate line 301b extending in correspondence to the first area of the semiconductor layer 303c of the second transistor T2 plays a role of the gate electrode of the second transistor T2.

In addition, the first plate 302c and the gate electrode 301a of the driving transistor DT are formed on the gate insulating film 311. The gate line 301b, the first plate 302c and the gate electrode 301a of the driving transistor DT are formed with the same gate electrode material by the same process.

An interlayer dielectric film 312 including an inorganic insulating material (e.g., oxide silicon (SiO2) or nitride silicon (SiNx)) or an organic insulating material is formed on the gate line 301b, the first plate 302c and the gate electrode 301a of the driving transistor DT and a whole surface of the substrate 300. The interlayer dielectric film 312 includes first and second contact holes 313a and 313b exposing the second areas 303ab positioned at the both sides of the first area 303aa of the semiconductor layer 303a of the driving transistor DT, respectively. In addition, the interlayer dielectric film 312 includes third and fourth contact holes 313c and 313d exposing the second areas 303bb positioned at both sides of the first area 303ba of the semiconductor layer 303b of the first transistor T1, respectively. In addition, the interlayer dielectric film 312 includes fifth and sixth contact holes 313e and 313f exposing the first plate 302c in an area adjacent to one of the second area 303ab of the semiconductor layer 303a of the driving transistor DT and one of the second area 303bb of the semiconductor layer 303b of the first transistor T1.

The driving voltage line 305, the data line 306 and the like defining the pixel area P by intersecting with the gate line 301b are formed on the interlayer dielectric film 312 including the first to sixth contact holes 313a to 313f.

In addition, the driving voltage line 305 connected to the second area 303ab of the semiconductor layer 303a of the driving transistor through the first contact hole 313a is formed on the interlayer dielectric film 312 including the first to sixth contact holes 313a to 313f. A portion of the driving voltage line, which is connected to the second area 303ab of the semiconductor layer 303a of the driving transistor DT through the first contact hole 313a plays a role of the source electrode of the driving transistor DT.

In addition, the drain electrode 307c of the driving transistor DT, which is spaced apart from the driving voltage line 305, connected to the second area 303ab of the semiconductor layer 303a of the driving transistor DT through the second contact hole 313b, and connected to the first plate 302c through the fifth contact hole 313e is formed on the interlayer dielectric film 312.

In addition, the source electrode 307e of the first transistor T1, which is connected to the first plate 302c through the sixth contact hole 313f and connected to the second area 303bb of the semiconductor layer 303c of the second transistor T2 through the third contact hole 313c is formed on the interlayer dielectric film 312.

In addition, the drain electrode 307a of the first transistor T1, which is connected to the second area 303bb of the oxide semiconductor layer 303b through the fourth contact hole 313d, and connected to the connection pattern CP of FIG. 3 through another contact hole, is formed on the interlayer dielectric film 312.

In addition, the second plate 307d forming the storage capacitor Cst by including the portion connected to the gate electrode 301a of the driving transistor through the contact hole in a position corresponding to the first plate 302c and the portion playing a role of the source electrode of the second transistor T2 is formed on the interlayer dielectric film 312. That is, the gate electrode 301a of the driving transistor DT is connected to the second plate 307d through the contact hole, and the second plate 307d is connected to the second area 303cd of the semiconductor layer 303c through another contact hole.

The first plate 302c and the second plate 307d, which are sequentially laminated in the pixel area, play a role of forming the storage capacitor Cst.

The semiconductor layer 303a which is sequentially laminated in the pixel area, the gate electrode 301a formed on the gate insulating film, the portion formed on the interlayer dielectric film 312 and playing a role of the source electrode of the driving voltage line 305 connected to the second area 303ab of the oxide semiconductor layer 303a through first and second contact holes 313a and 313b, and the drain electrode 307c forms the driving transistor DT.

In addition, the oxide semiconductor layer 303b, which is sequentially laminated in the pixel area, the gate electrode 301b formed on the gate insulating film, and the source electrode 307e and the drain electrode 307a formed on the interlayer dielectric film 312 and connected to the second area 303bb of the oxide semiconductor layer 303b through the third and fourth contact holes 313c and 313d form the first transistor T1.

Next, a protection film 313 including an inorganic insulating material (e.g., oxide silicon (SiO2) or nitride silicon (SiNx)) or an organic insulating material (e.g., benzocyclobutene or photoacryl) is formed on a whole surface of the substrate 300 on which the driving transistor DT, the first transistor T1 and the storage capacitor Cst are formed. At this time, the protection film 313 includes a source contact hole 315 exposing the source electrode 307e.

In addition, the pixel electrode 308 connected to the source electrode 307e through the source contact hole 315 and extending upto a light emitting area is formed on the protection film 313 including the source contact hole 315. The pixel electrode 308 and the source electrode 307e which are sequentially laminated in the pixel area are connected through the source contact hole 315, and the first plate 302c and the source electrode 307e are connected through the source contact hole 315. The pixel electrode 308 and the first plate 302c form the double storage capactor Cst together with the second plate 307d.

A planarization film 314 is formed on the protection film 313. The planarization film 314 is not formed between the pixel electrode 308 and the second plate 307d in order to form the storage capacitor Cst.

In a process for the display panel 11 of the organic light emitting display device 10, according to the first embodiment, a top gate in which the gate electrode 301a is positioned over the semiconductor layer 303b is described, but is an example for convenience of description. In an alternative process, a bottom gate in which the gate electrode 301a is positioned under the semiconductor layer 303b may be provided for the display panel 11 of the organic light emitting display device 10 according to the first embodiment. In the case of the bottom gate, the pixel structure may be changed in correspondence to the bottom gate. Meanwhile, semiconductor layers 303a, 303b and 303c may be, for example, oxide semiconductors, are not limited thereto, and may be amorphous silicon, poly silicon that is obtained by crystallizing amorphous silicon, organic semiconductors (hereinafter, it is the same as above).

Aspects of a Second Embodiment

Figure 6A:
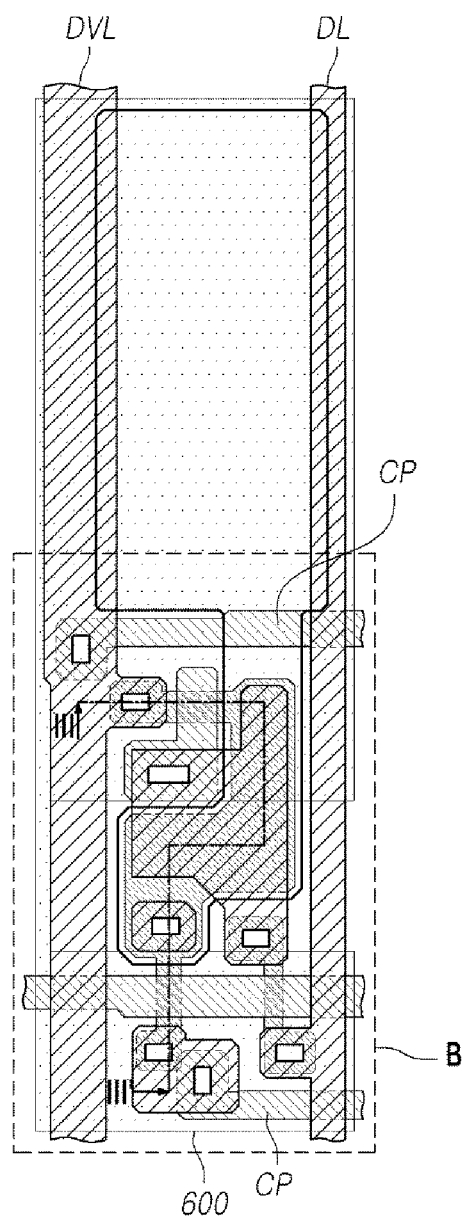
FIG. 6A is a plan view schematically illustrating a portion of a display panel of an organic light emitting display device according to a second embodiment.
Figure 6B:
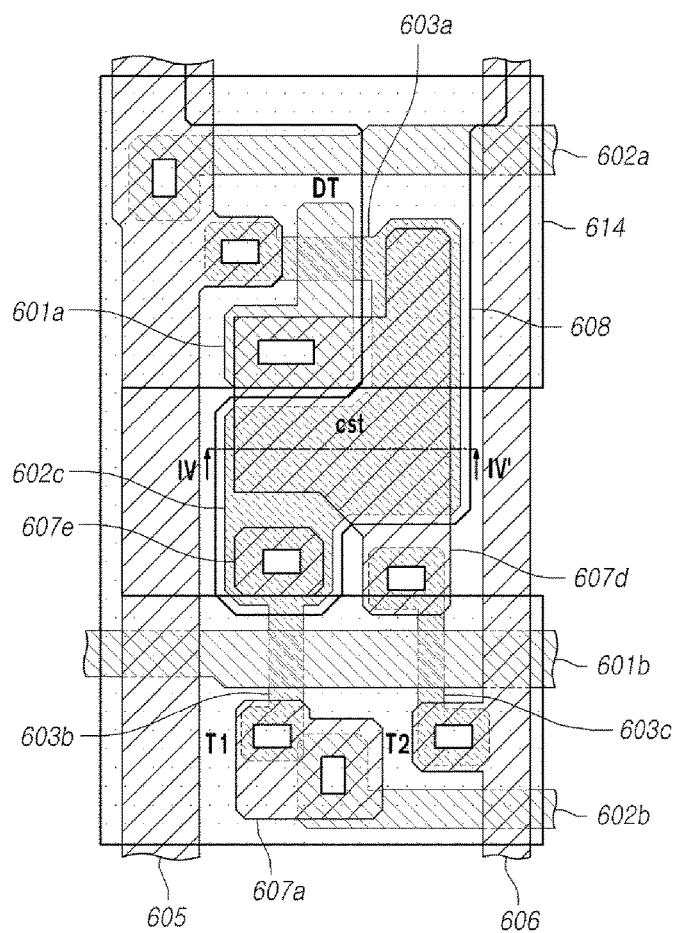
FIG. 6B is an enlarged view of a portion B in FIG. 6A, according to the second embodiment.

FIG. 6A is a plan view schematically illustrating a portion of a display panel of an organic light emitting display device according to a second embodiment. FIG. 6B is an enlarged view of a portion B in FIG. 6A, according to the second embodiment.

Referring to FIGS. 6A and 6B, each pixel of the second embodiment, which is connected to a driving voltage line DVL for providing a driving voltage EVDD and a data line DL analogous to the first embodiment, includes a 3T1C based scan structure in which a driving transistor DT, a first transistor T1, and a second transistor T2 are formed on a substrate 600. Some pixels may not be directly connected to the driving voltage line DVL and a reference voltage line RVL, and may be connected to each of the driving voltage line DVL and the reference voltage line RVL through a connection pattern CP.

As shown in FIGS. 6A and 6B, a semiconductor layer 603a of each driving transistor DT, a semiconductor layer 603b of each first transistor T1 and a semiconductor layer 603c of each second transistor T2 are formed on the substrate 600.

The driving transistor DT includes the semiconductor layer formed with an oxide semiconductor material, and is for driving an OLED.

The first transistor T1 includes the semiconductor layer formed with an oxide semiconductor material, is controlled by a scan signal, and is connected between a first node of the driving transistor DT and the reference voltage line RVL.

The second transistor T2 includes the semiconductor layer formed with an oxide semiconductor material, is controlled by the scan signal commonly provided through a gate line, and is connected between a second node of the driving transistor DT and data line DL.

A conductive characteristic of a portion of the semiconductor layer 603a of the driving transistor DT is improved, the portion of the semiconductor layer 603a of the driving transistor DT, of which the conductive characteristic is improved is connected to the driving voltage line DVL.

A conductive characteristic of a portion of the semiconductor layer 603b of the first transistor T1 is improved, the portion of the semiconductor layer 603b of the first transistor T1, of which the conductive characteristic is improved is connected to the reference voltage line RVL.

The semiconductor layer 603a of the driving transistor DT, the semiconductor layer 603b of the first transistor T1, the semiconductor layer 603c of the second transistor T2, and a first plate 607d are simultaneously formed in the same layer.

The first plate 607d connects the semiconductor layer 603a of the driving transistor DT with the semiconductor layer 603b of the first transistor T1, and is integrally formed.

The semiconductor layer 603a of the driving transistor DT, the semiconductor layer 603b of the first transistor T1, the semiconductor layer 603c of the second transistor T2, and a first plate 602c are formed with an oxide semiconductor material. In addition, the first plate 602c connects the semiconductor layer 603a of the driving transistor DT with the semiconductor layer 603b of the first transistor T1, and is integrally formed. The oxide semiconductor material may be zinc-oxide series material, and may be zinc-oxide series material including indium. Specifically, the oxide semiconductor material may be Indium Gallium Zinc Oxide (IGZO), Zinc Tin Oxide (ZTO), Zinc Indium Oxide (ZIO), and the like.

A conductive characteristic of the oxide semiconductor material may be improved, when the oxide semiconductor material is exposed to a plasma or impurities are added to the oxide semiconductor material.

Specifically, the semiconductor layer 603a of each driving transistor DT is formed in correspondence to an area where a gate electrode 601a of each driving transistor DT is formed. The semiconductor layer 603b of each first transistor T1 is formed in correspondence to a portion playing a role of a gate electrode in a gate line 601b of each first transistor T1. The semiconductor layer 603c of each second transistor T2 is formed in correspondence to a portion playing a role of a gate electrode in a gate line 601b of each second transistor T2.

Next, the gate electrode 601a of each driving transistor DT, the gate line 601b for forming the gate electrodes of the first and second transistors T1 and T2, a connection pattern 602a connected to each driving voltage line DVL, and a connection pattern 602b connected to each reference voltage line RVL are formed, on the substrate 600 on which the semiconductor layer 603a of each driving transistor DT, the semiconductor layer 603b of each first transistor T1 and the semiconductor layer 603c of each second transistor T2 are formed. Here, the gate line 601b is a common gate line for commonly applying the scan signal to the gate electrodes of the first and second transistors T1 and T2 included in each pixel, which are connected to the gate line 601b.

Next, signal lines such as the driving voltage line 605 and the data lines 606 corresponding each pixel row are formed on the substrate 600.

The semiconductor layer 603a of the driving transistor DT, the semiconductor layer 603b of the first transistor T1, the semiconductor layer 603c of the second transistor T2, and the first plate 602c are conductive by a plasma process or impurities addition, except for a first area where the gate electrode 601a and the gate line 601b are covered.

A drain electrode 607a of the first transistor T1, which is connected to the connection pattern 602b (i.e., the connection pattern of the reference voltage line) formed on the substrate 600 through a contact hole, a second plate 607d playing a role of forming a storage capacitor Cst by including a portion connected to the gate electrode 601a of the driving transistor DT of each pixel through a contact hole and a portion playing a role of a source electrode of the second transistor T2 of each pixel, and the like are further formed.

The first plate 602c connected to the semiconductor layer 603a of the driving transistor DT, and a pixel electrode of the OLED connected to a pattern 607e of the first transistor T1 through a contact hole in each pixel are formed in each pixel. The pixel electrode 608 is positioned on the first plate 602c and the second plate 607d and forms the storage capacitor. A protection film 613 is formed on the substrate 600 including the second plate 607d. A planarization film 614 may be further formed. The planarization film 614 may not be formed in a portion of the storage capacitor Cst.

A pixel defining film (referred to as a bank) 609 which defines the pixel is formed. An organic layer (not shown) including a light emitting layer corresponding to each pixel may be laminated on the pixel defining film 609, and a common electrode for all pixels may be laminated on the organic layer. Meanwhile, in a case of a White Organic Light Emitting Diode (WOLED), an organic layer including the same light emitting layer may be laminated and a color filter may be formed in a light emitting direction in all pixels.

Figure 7:
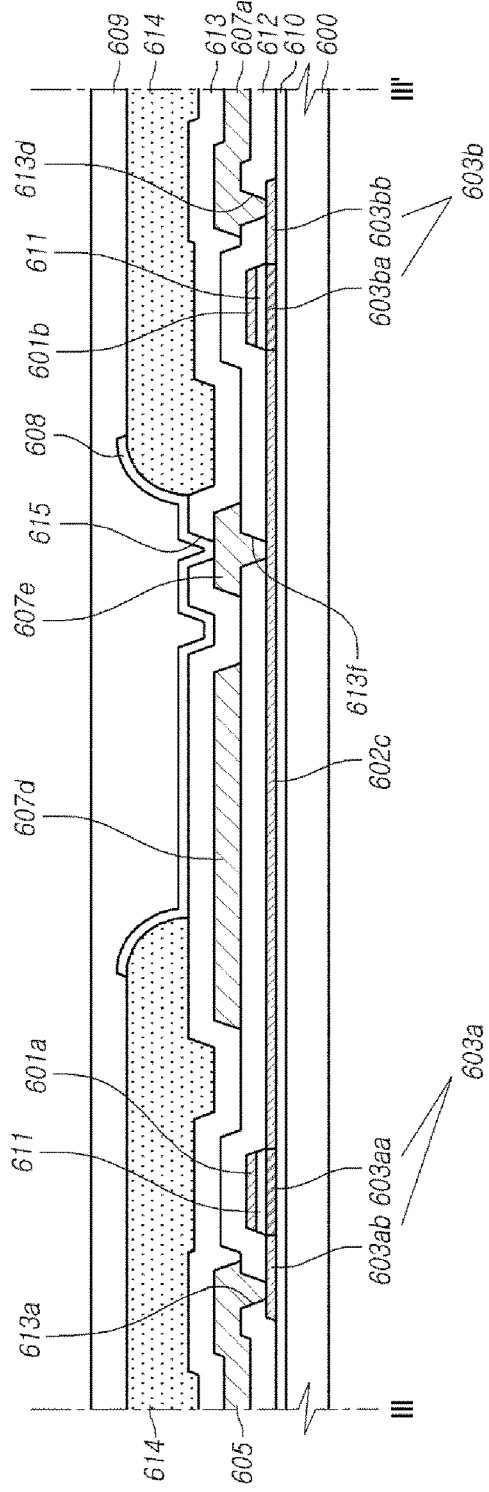
FIG. 7 is a cross-sectional view taken along a cutting line III-III' of FIG. 6A, according to one or more embodiments.
Figure 8:
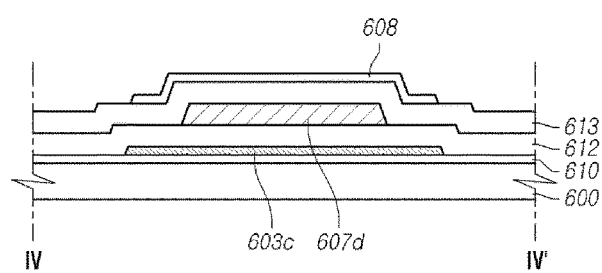
FIG. 8 is a cross-sectional view taken along a cutting line IV-IV' of FIG. 6B, according to one or more embodiments.

FIG. 7 is a cross-sectional view taken along a cutting line III-III' of FIG. 6A. FIG. 8 is a cross-sectional view taken along a cutting line IV-IV' of FIG. 6B.

Referring to FIGS. 6A to 8, a buffer layer 610 is formed on the substrate 600. The semiconductor layer 603a of the driving transistor DT and the semiconductor layer 603b of each first transistor T1 are formed on the substrate 600 on which the buffer layer 610 is formed. As described above, although not shown in FIG. 8, the semiconductor layer 603c of the second transistor T2 is formed on the substrate equally to the semiconductor layer 603a of the driving transistor DT and the semiconductor layer 603b of each first transistor T1. In addition, the first plate 602c connects the semiconductor layer 603b of the first transistor T1 with the semiconductor layer 603c of the second transistor T2, and is integrally formed.

Next, a gate insulating film 611 is formed on first areas 603aa and 603ba of the semiconductor layer 603b of the first transistor T1 and the semiconductor layer 603c of the second transistor T2. At this time, the gate insulating film 611 is formed in correspondence to a first area of the semiconductor layer 603c.

Next, the gate line 601b having a plane form equal to that of the gate insulating film 611 and extending in a direction on the gate insulating film 611 formed on the substrate 600 is formed. The gate line 601b formed on a first area 603ab plays a role of the gate electrode of the first transistor T1. The gate line 601b extends in a direction on the gate insulating film 611 which is formed in correspondence to the first area of the semiconductor layer 603c. The gate line 601b extending in correspondence to the first area of the semiconductor layer 603c plays a role of the gate electrode of the second transistor T2.

The semiconductor layer 603b of the first transistor T1, the semiconductor layer 603c of the second transistor T2 and the first plate 602c may be formed with oxide semiconductor material, and may be conductive by a plasma process or impurities addition.

Each of the semiconductor layers 603a and 603b includes first areas 603aa and 603ba where a plasma is not processed in central areas thereof, and second areas 603ab and 603bb, which are conductive and positioned at both sides of the first areas 603aa and 603ba. In addition, the first plate 602c is also conductive.

he semiconductor layer 603c of the second transistor T2 includes a first area where a plasma is not processed in a central area thereof, and second areas, which are conductive by a plasma process and positioned at both sides of the first area.

An interlayer dielectric film 612 including an inorganic insulating material (e.g., oxide silicon (SiO2) or nitride silicon (SiNx)) or an organic insulating material is formed on the gate line 601b, the first plate 602c and the gate electrode 601a of the driving transistor DT and a whole surface of the substrate 600.

At this time, the interlayer dielectric 612 includes a first contact hole 613a exposing the second area 603ab of the semiconductor layer 603a of the driving transistor DT, a fourth contact hole exposing the second area 603bb of the first transistor T1, and a sixth contact hole 613f exposing the first plate 602c in a position adjacent to the first transistor T1.

It should be noted that, as illustrated in FIG. 7, the semiconductor layer 603b of the first transistor T1, the semiconductor layer 603c of the second transistor T2 and the first plate 602c are integrally formed (e.g., directly connected or physically unified) in the second embodiment. Thus, in contrast to the first embodiment and the illustration of FIG. 4, where the contact holes 313b, 313c and 313e that were provided in the first embodiment (see FIG. 4) in order to electrically connect the first plate 302c with the gate electrode 301a of the driving transistor and the first transistor T1, such contact holes are omitted in this second embodiment. Consequently, since some contact holes (such as 313b, 313c, and 313e of FIG. 4) are omitted in the second embodiment, an opening ratio of a light emitting area of an organic light emitting device can be increased.

A driving voltage line 605 connected to the second area 603ab of the oxide semiconductor layer 603a through the first contact hole 613a of the driving transistor DT is formed on the interlayer dielectric film 612. A portion of the driving voltage line 605, which is connected to the second area 603ab of the semiconductor layer 603a of the driving transistor DT through the first contact hole 613a plays a role of the source electrode of the driving transistor DT.

In addition, a drain electrode 607a of the driving transistor DT, which is connected to the second area 603bb of the semiconductor layer 603b of the first transistor T1 through the fourth contact hole 613d and connected to the connection pattern CP of FIG. 6 is formed on the interlayer dielectric film 612.

In addition, the pattern 607e formed with source/drain electrode material is formed on the interlayer dielectric film 612. The pattern 607e connects the first plate 602c with the pixel electrode 608.

In addition, the second plate 607d forming the storage capacitor Cst by including the portion connected to the gate electrode 601a of the driving transistor through the contact hole in a position corresponding to the first plate 602c and the portion playing a role of the source electrode of the second transistor T2 is formed on the interlayer dielectric film 612. That is, the gate electrode 601a of the driving transistor DT is connected to the second plate 607d through the contact hole, and the second plate 607d is connected to the second area 603 of the semiconductor layer 603c of the second transistor T2 through another contact hole.

Next, a protection film 613 including an inorganic insulating material (e.g., oxide silicon (SiO2) or nitride silicon (SiNx)) or an organic insulating material (e.g., benzocyclobutene or photoacryl) is formed on a whole surface of the substrate 600 on which the driving transistor DT, the first transistor T1 and the storage capacitor Cst are formed. The protection film 613 includes a source contact hole 615 exposing the pattern 607e.

In addition, the pixel electrode 608 connected to the pattern 607e through the source contact hole 615 and extending upto a light emitting area is formed on the protection film 613 including the source contact hole 615. The pixel electrode 608 may be an anode electrode. The pixel electrode 608 and the pattern 607e which are sequentially laminated in a pixel area are connected through the source contact hole 615, and the first plate 602c and the source electrode 607e are connected through the source contact hole 615. The pixel electrode 608 and the first plate 602c form the double storage capacitor Cst together with the second plate 607d.

Aspects of a Third Embodiment

Figure 9A:
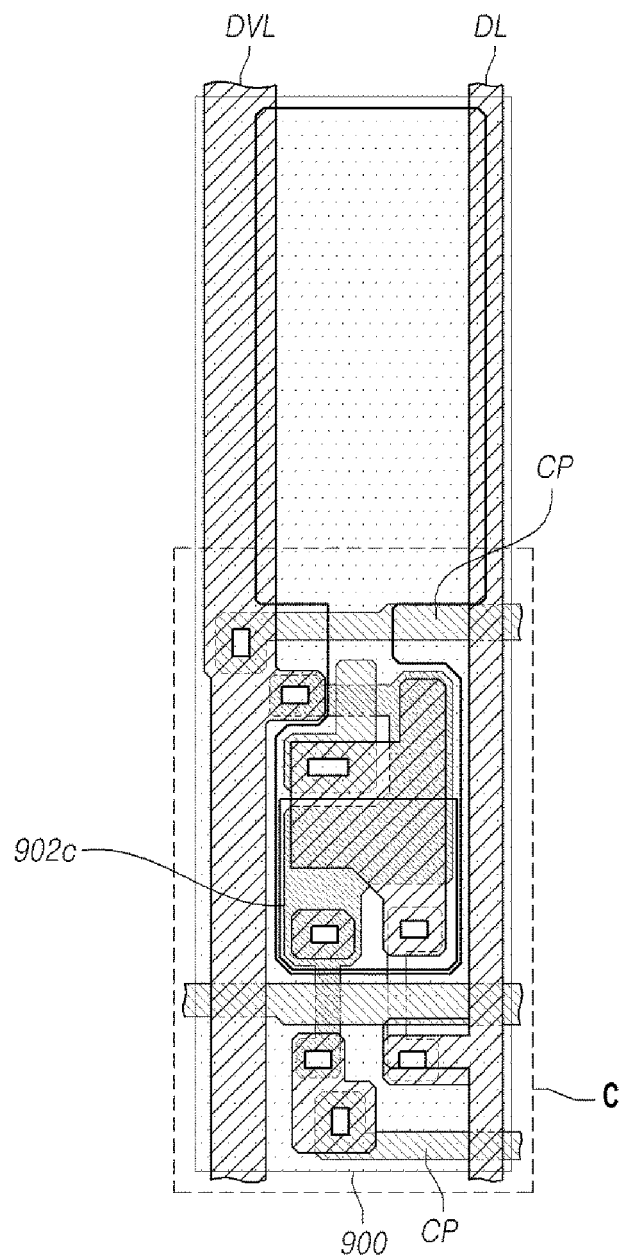
FIG. 9A is a plan view schematically illustrating a portion of a display panel of an organic light emitting display device according to a third embodiment.
Figure 9B:
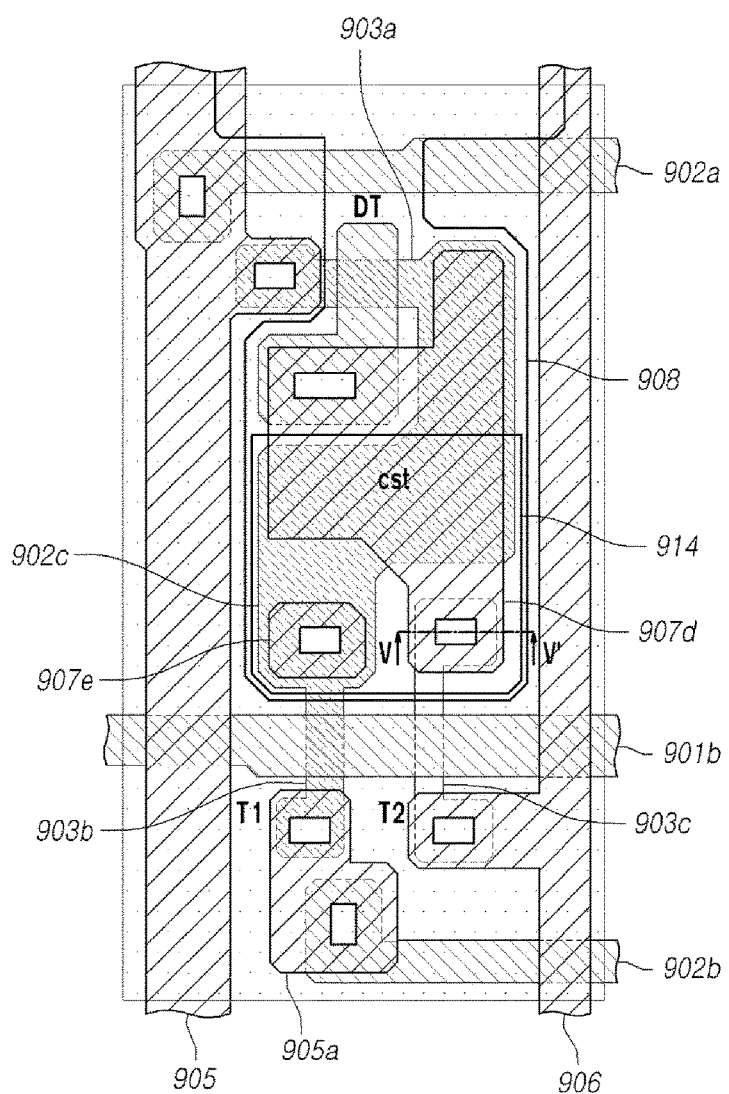
FIG. 9B is an enlarged view of a portion C in FIG. 9A, according to the third embodiment.

FIG. 9A is a plan view schematically illustrating a portion of a display panel of an organic light emitting display device according to a third embodiment. FIG. 9B is an enlarged view of a portion C in FIG. 9A, according to the third embodiment.

The third embodiment is analogous to the second embodiment except a pixel electrode 908 is fomed a little larger than that of the second embodiment and some planarization film 914 is not formed between the pixel electrode 908 and a second plate 907d and thus repetitive explanation will be omitted.

Referring to FIGS. 9A and 9B, in the organic light emitting display device, according to the third embodiment, each pixel connected to a driving voltage line DVL for providing a driving voltage EVDD and a data line DL equally to the second embodiment includes a 3T1C based scan structure in which a driving transistor DT, a first transistor T1 and a second transistor T2 are formed on a substrate 900. At this time, some pixels may be connected to each of the driving voltage line DVL and a reference voltage line RVL through a connection pattern.

Next, various signal lines, such as a driving voltage line 905 and data lines 906 corresponding to each pixel row, are formed on the substrate 900. A semiconductor layer 903a of each driving transistor DT formed with an oxide semiconductor material, a semiconductor layer 903b of the first transistor T1, a semiconductor layer 903c of the second transistor T2 and a first plate 902c are formed on the substrate 900. At this time, the semiconductor layer 903a of the driving transistor DT, the semiconductor layer 903b of the first transistor T1 and the first plate 902c are integrally formed analogously to the second embodiment.

Next, the gate electrode 901a of each driving transistor DT, the gate line 901b for forming the gate electrodes of the first and second transistors T1 and T2, a connection pattern 902a connected to each driving voltage line DVL, and a connection pattern 902b connected to each reference voltage line RVL are formed, on the substrate 900 on which the semiconductor layer 903a of each driving transistor DT, the semiconductor layer 903b of each first transistor T1 and the semiconductor layer 903c of each second transistor T2 are formed. Here, the gate line 901b is a common gate line for commonly applying the scan signal to the gate electrodes of the first and second transistors T1 and T2 included in each pixel, which are connected to the gate line 901b.

At this time, equally to the second embodiment, the first plate 902c connects the driving transistor DT and the first transistor, is formed with an oxide semiconductor material, and is conductive.

The first plate 902c and the second plate 907d are formed, and an interlayer dielectric film 912 is between the first plate 902c and the second plate 907d. In addition, the second plate 907d and the pixel electrode 908 are formed, and a protection film 913 is between the second plate 907d and the pixel electrode 908.

A planarization film 914 is further formed between the protection film 913 and the pixel electrode 902. However, the planarization film 914 is not formed in an area corresponding to the second plate 907d in order to increase a capacitance of a double storage capacitor Cst. At this time, the planarization film 914 covers a portion of the second plate 907d except for a portion of the driving transistor DT of the voltage pixel electrode 908, and thus the capacitance of the storage capacitor can be maximized. In addition, the planarization film 914 is formed on the driving voltage line VDL too, and thus a defect between wires can be prevented.

Figure 10:
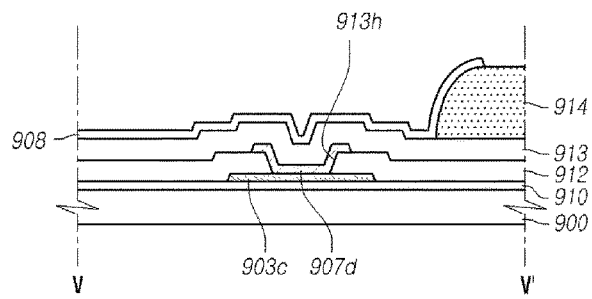
FIG. 10 is a cross-sectional view taken along a cutting line V-V' of FIG. 9B, according to one or more embodiments.

FIG. 10 is a cross-sectional view taken along a cutting line V-V' of FIG. 9B.

Referring to FIG. 10, the semiconductor layer 903c of the second transistor T2 is formed on a buffer layer 910 of the substrate 900.

The interlayer dielectric 912 includes a seventh contact hole 913h exposing a portion of the semiconductor layer 903c of the second transistor T2, and is formed on the second transistor T2.

The second plate 907d is connected to the semiconductor layer 903c of the second transistor T2 through the seventh contact hole 913h, and is connected to the gate electrode 901a of the driving transistor DT through another contact hole.

In addition, the protection film 913 is formed on the substrate 900 on which the second plate 907d is formed. The planarization film 914 is formed in a portion corresponding to the second plate 907d on the protection film 913. In addition, the pixel electrode 908 corresponding to the second plate 907d is formed on the substrate 900. The pixel electrode 908 corresponds to the second plate 907d, and plays a role of the storage capacitor.

Thus, the organic light emitting display device according to the third embodiment includes the double storage capacitor Cst including the first plate 902c, the second plate 907d and the pixel electrode 908.

At this time, the planarization film 914 is not formed on the second contact hole 913h. Therefore, a short between the second plate 907d and the pixel electrode 908 formed in correspondence to the seventh contact hole 913h may occur due to a step difference according to the seventh contact hole 913h, and a fourth embodiment will be described as a method of enhancing this.

Aspects of a Fourth Embodiment

Figure 11A:
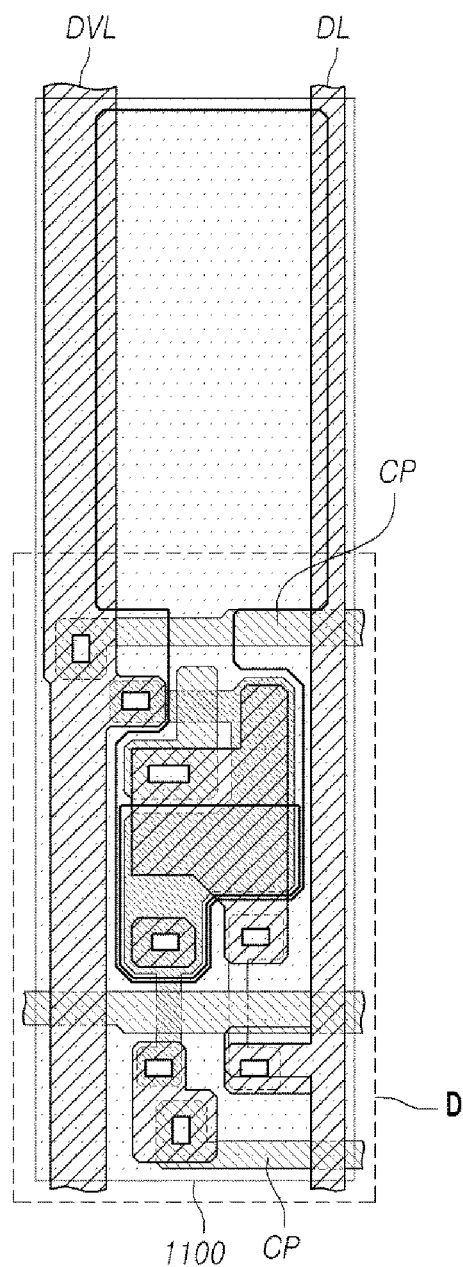
FIG. 11A is a plan view schematically illustrating a portion of a display panel of an organic light emitting display device according to a fourth embodiment.
Figure 11B:
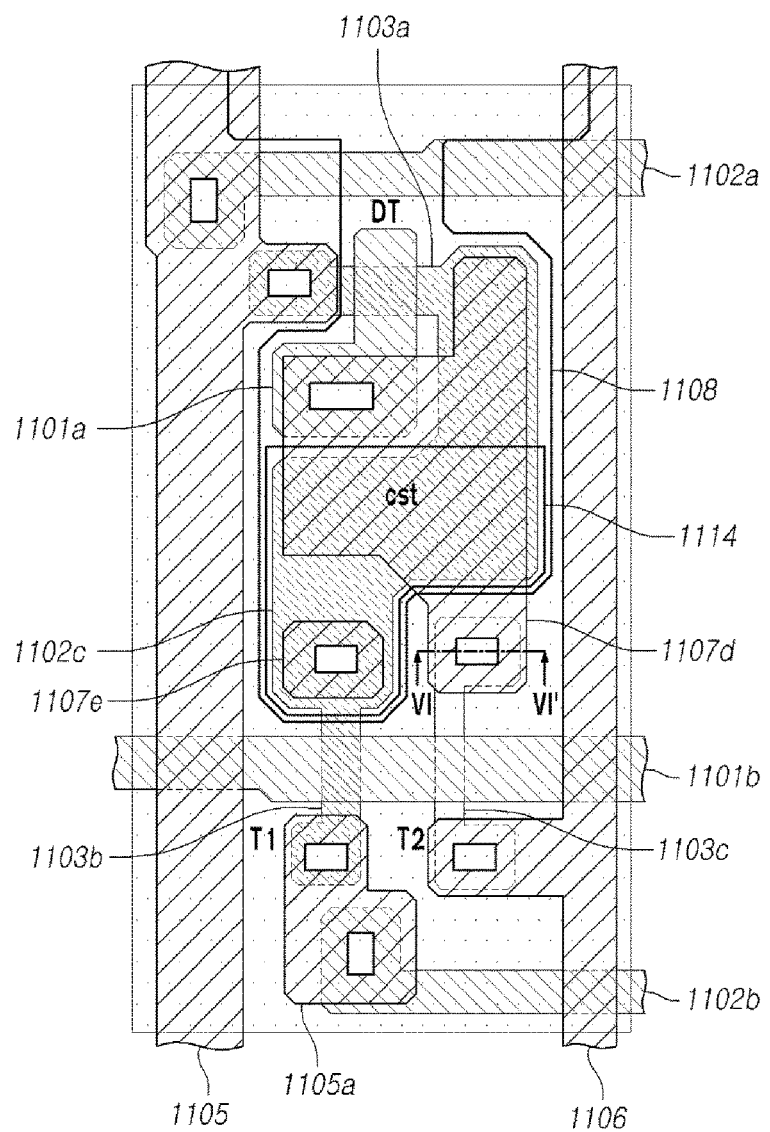
FIG. 11B is an enlarged view of a portion D in FIG. 11A, according to the fourth emodiment.

FIG. 11A is a plan view schematically illustrating a portion of a display panel of an organic light emitting display device according to a fourth embodiment. FIG. 11B is an enlarged view of a portion D in FIG. 11A, according to the fourth embodiment.

The fourth embodiment is substantially the same as the third embodiment except for a planarization film 1114 formed between a pixel electrode 1108 and a second plate 1107d positioned on a seventh contact hole 1117h of a second transistor T2.

Referring to aspects of the fourth embodiment (FIGS. 11A and 11B) that are analogous to the third embodiment (FIGS. 9A-9B), a 3T1C based 1 scan structure in which a driving transistor DT, a first transistor T1 and the second transistor T2 are formed is formed on a substrate 1100. At this time, the driving transistor DT, the first transistor T1 and the second transistor T2 are connected to a driving voltage line DVL and a data line DL equally to the third embodiment. At this time, some pixels may not be directly connected to the driving voltage line DVL and a reference voltage line RVL, and may be connected to each of the driving voltage line DVL and the reference voltage line RVL through a connection pattern CP.

Next, various signal lines such as a driving voltage line 1105 and data lines 1106 corresponding to each pixel row are formed on the substrate 1100. A semiconductor layer 1103a of each driving transistor DT formed with an oxide semiconductor material, a semiconductor layer 1103b of the first transistor T1, a semiconductor layer 1103c of the second transistor T2 and a first plate 1102c are formed on the substrate 1100. At this time, the semiconductor layer 1103a of the driving transistor DT, the semiconductor layer 1103b of the first transistor T1 and the first plate 1102c are integrally formed equally to the second embodiment.

Next, a gate electrode 1101a of each driving transistor DT, a gate line 1101b for forming gate electrodes of the first and second transistors T1 and T2, a connection pattern 1102a connected to each driving voltage line DVL, and a connection pattern 1102b connected to each reference voltage line RVL are formed, on the substrate 1100 on which the semiconductor layer 1103a of each driving transistor DT, the semiconductor layer 1103b of each first transistor T1 and the semiconductor layer 1103c of each second transistor T2 are formed. Here, the gate line 1101b is a common gate line for commonly applying the scan signal to the gate electrodes of the first and second transistors T1 and T2 included in each pixel, which are connected to the gate line 1101b.

As explained with reference to the second embodiment, the first plate 1102c connects the driving transistor DT and the first transistor, is formed with an oxide semiconductor material, and is conductive.

The first plate 1102c and the second plate 1107d are formed, and an interlayer dielectric film 1112 is between the first plate 1102c and the second plate 1107d. In addition, the second plate 1107d and a pixel electrode 1108 are formed, and a protection film 1113 is between the second plate 1107d and the pixel electrode 1108. A planarization film 1114 is further formed between the protection film 1113 and the pixel electrode 1108. However, the planarization film 1114 is not formed in an area corresponding to the second plate 1107d in order to increase a capacitance of a double storage capacitor. The planarization film 1114 covers a portion of the second plate 1107d except for a portion of the driving transistor DT of the pixel electrode 1108, and thus a short between the second plate 1107d and the pixel electrode 1108 can be prevented.

That is, a portion of the first plate 1102c and a portion of the second plate 1107d overlap, and the second plate 1107d and a portion of the pixel electrode 1108 overlap to play a role of the storage capacitor Cst. The planarization film 1114 is not formed on the portion of the first plate 1102c, the portion of the second plate 1107d and the portion of the pixel electrode 1108 which are overlapped.

The second plate 1107d is connected to the semiconductor layer 1103c of the second transistor T2 through a contact hole 1113h. The planarization film 1114 is formed on the second plate 1107d corresponding to the contact hole 1113h. Therefore, a short between the pixel electrode 1108 and the second plate 1107d due to a step difference according to a contact hole can be prevented.

Figure 12:
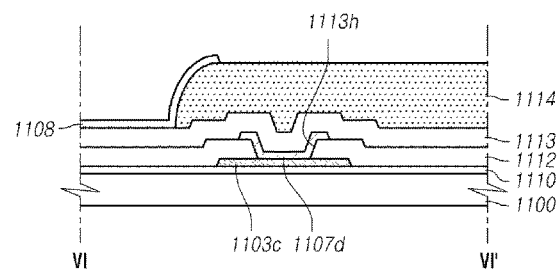
FIG. 12 is a cross-sectional view taken along a cutting line VI-VI' of FIG. 11B, according to one or more embodiments.

FIG. 12 is a cross-sectional view taken along a cutting line VI-VI' of FIG. 11B.

Referring to FIG. 12, a buffer layer 1110 is formed on the substrate 1100. The semiconductor layer 1103c of the second transistor T2 is formed on the buffer layer 1110.

The interlayer dielectric film 1112 includes the seventh contact hole 1113h exposing a portion of the semiconductor layer 1103c of the second transistor T2, and is formed on the second transistor T2.

The second plate 1107d is connected to the semiconductor layer 1103c of the second transistor T2 through the seventh contact hole 1113h, and is connected to the gate electrode 1101a of the driving transistor DT through another contact hole.

In addition, the protection film 1113 is formed on the substrate 1100 on which the second plate 1107d is formed. The planarization film 1114 is formed in a portion corresponding to the second plate 1107d on the protection film 1113. In addition, the pixel electrode 1108 corresponding to the second plate 1107d is formed on the substrate 1100.

At this time, the planarization film 1114 is formed on a portion where the second transistor 1103c and the second plate 1107d are connected through the seventh contact hole 1113h, and thus a short between the pixel electrode 1108 and the second plate 1107d due to the seventh contact hole 1113h can be prevented.

While the technical spirit of the present disclosure has been exemplarily described with reference to the accompanying drawings, it will be understood by a person skilled in the art that the present disclosure may be varied and modified in various forms without departing from the scope of the present disclosure. Accordingly, the embodiments disclosed in the present disclosure are merely to not limit but describe the technical spirit of the present disclosure. Further, the scope of the technical spirit of the present disclosure is limited by the embodiments. The scope of the present disclosure shall be construed on the basis of the accompanying claims in such a manner that all of the technical ideas included within the scope equivalent to the claims belong to the present disclosure.

What is claimed is:

1. An organic light emitting display device comprising:
   a driving transistor including a first gate electrode, a first source electrode, a first drain electrode, and a first oxide semiconductor region having at least a first channel area, and the driving transistor for driving an organic light emitting diode and on a substrate;
   a first transistor including a second gate electrode, a second source electrode, a second drain electrode, and a second oxide semiconductor region having at least a second channel area, the first transistor controlled by a scan signal, and connected between a reference voltage line and a first node of the driving transistor;
   a second transistor including a third oxide semiconductor region having at least a third channel area, the second transistor controlled by the scan signal commonly provided from a gate line, and connected between a data line and a second node of the driving transistor;
   a first plate connected to one of the first source electrode and the first drain electrode of the driving transistor and one of the second source electrode and the second drain electrode of the first transistor, the first plate in a same layer as the first gate electrode of the driving transistor and the second gate electrode of the first transistor, the first plate positioned at a first distance from the substrate;
   a second plate positioned on the first plate, and connected to the third oxide semiconductor region of the second transistor and the first gate electrode of the driving transistor, the second plate positioned at a second distance from the substrate greater than the first distance; and
   a pixel electrode of the organic light emitting diode, positioned on the second plate and connected to the first plate through a contact hole, the second plate positioned between the first plate and the pixel electrode.

2. The organic light emitting display device of claim 1, wherein the pixel electrode is connected to the first plate through the contact hole adjacent to the second oxide semiconductor region of the first transistor.

3. The organic light emitting display device of claim 1, further comprising:
   a planarization film located on the second plate between the second plate and the pixel electrode,
   wherein the second plate is connected to the third oxide semiconductor region of the second transistor through a different contact hole, and the planarization film is located on the second plate corresponding to the different contact hole.

4. The organic light emitting display device of claim 3, wherein a first portion of the first plate overlaps a second portion of the second plate and the second plate overlaps a third portion of the pixel electrode to play a role of a storage capacitor, wherein the planarization film is not located on the first portion of the first plate, the second portion of the second plate, and the third portion of the pixel electrode.

5. The organic light emitting display device of claim 1, wherein a drain area and a source area outside the first channel area of the first oxide semiconductor region of the driving transistor, the second oxide semiconductor region of the first transistor, and the third oxide semiconductor region of the second transistor is improved by exposing oxide semiconductor material of the first plate to a plasma or adding impurities to the oxide semiconductor material of the first plate.

6. The organic light emitting display device of claim 1, wherein the first oxide semiconductor region of the driving transistor, the second oxide semiconductor region of the first transistor, and the third oxide semiconductor region of the second transistor are comprised of zinc-oxide series material including indium.

7. The organic light emitting display device of claim 1, wherein the first transistor is a sensing transistor, which compensates a luminance deviation between pixels, and the second transistor is a switching transistor selecting the driving transistor.

8. The organic light emitting display device of claim 1, wherein the first gate electrode of the driving transistor, the second gate electrode of the first transistor, a third gate electrode of the second transistor, and the first plate are simultaneously formed in the same layer.

9. The organic light emitting display device of claim 1, wherein:
   a portion of the first oxide semiconductor region of the driving transistor is connected to a driving voltage line, and
   another portion of the second oxide semiconductor region of the first transistor is connected to the reference voltage line.

10. The organic light emitting display device of claim 1, wherein the first plate, the second plate, and the pixel electrode are a double capacitor.

11. The organic light emitting display device of claim 1, wherein the second plate is above the first plate and below the pixel electrode.

12. The organic light emitting display device of claim 1, wherein the first oxide semiconductor region of the driving transistor comprises a drain area and a source area.

* * * * *